US 9,564,868 B2

(12) United States Patent
Nguyen et al.

(10) Patent No.: US 9,564,868 B2
(45) Date of Patent: Feb. 7, 2017

(54) BALUN

(71) Applicant: BAE SYSTEMS plc, London (GB)

(72) Inventors: Mark Christopher Nguyen, Chelmsford-Essex (GB); Gareth Michael Lewis, Chelmsford-Essex (GB); Richard John Harper, Chelmsford-Essex (GB)

(73) Assignee: BAE SYSTEMS plc, London (GB)

( * ) Notice: Subject to any disclaimer, the term of this patent is extended or adjusted under 35 U.S.C. 154(b) by 101 days.

(21) Appl. No.: 14/407,738

(22) PCT Filed: Jun. 17, 2013

(86) PCT No.: PCT/GB2013/051573
§ 371 (c)(1),
(2) Date: Dec. 12, 2014

(87) PCT Pub. No.: WO2013/190276
PCT Pub. Date: Dec. 27, 2013

(65) Prior Publication Data
US 2015/0171816 A1 Jun. 18, 2015

(30) Foreign Application Priority Data

Jun. 19, 2012 (GB) .................................. 1210817.1

(51) Int. Cl.
*H01P 5/10* (2006.01)
*H03H 2/00* (2006.01)
*H03H 7/42* (2006.01)

(52) U.S. Cl.
CPC ................ *H03H 2/005* (2013.01); *H01P 5/10* (2013.01)

(58) Field of Classification Search
CPC ............. H01P 5/10; H01P 5/1007; H03H 7/42
(Continued)

(56) References Cited

U.S. PATENT DOCUMENTS 4,882,553 A * 11/1989 Davies .................. H01P 5/1007
333/246
6,498,540 B2  12/2002 Deckman
(Continued)

FOREIGN PATENT DOCUMENTS

JP       2241102 A    9/1990
JP    2001326508 A   11/2001
(Continued)

OTHER PUBLICATIONS

International Search Report and Written Opinion received for Patent Application No. PCT/GB2013/051573, mailed on Sep. 20, 2013. 12 pages.
(Continued)

*Primary Examiner* — Dean Takaoka
(74) *Attorney, Agent, or Firm* — Finch & Maloney PLLC

(57) ABSTRACT

There is disclosed a balun for dividing an input electrical signal to produce first and second output electrical signals which are substantially out of phase, the balun including: an input port for receiving the input electrical signal; an input line for coupling the input electrical signal to a slotline; and an output line for coupling the first and second output electrical signals to, respectively a first output port and a second output port, the output line having a junction with the slotline; wherein the slotline couples the input electrical signal to the junction, and the junction acts as a divider to produce the first and second electrical signals; in which at least one of the input line, slotline and output line has a width and a length wherein the width varies over the length.

19 Claims, 3 Drawing Sheets

(58) Field of Classification Search
USPC .............................................. 333/25, 26, 246
See application file for complete search history.

(56) References Cited

U.S. PATENT DOCUMENTS

| | | | |
|---|---|---|---|
| 6,538,614 | B2 | 3/2003 | Fleming et al. |
| 6,891,446 | B2 | 5/2005 | Tayrani et al. |
| 7,471,165 | B2 * | 12/2008 | Asamura .................... H01P 5/10 333/246 |
| 7,586,386 | B2 * | 9/2009 | Takahashi ............. H01P 5/1007 333/26 |
| 9,118,099 | B2 * | 8/2015 | Kim ......................... H01P 5/10 |
| 2002/0149440 | A1 | 10/2002 | Deckman |
| 2002/0196096 | A1 | 12/2002 | Tajima |
| 2004/0217823 | A1 | 11/2004 | Tayrani et al. |
| 2006/0208825 | A1 | 9/2006 | Takahashi |
| 2007/0001779 | A1 | 1/2007 | Asamura et al. |
| 2009/0140823 | A1 | 6/2009 | Lee et al. |
| 2009/0302967 | A1 | 12/2009 | Tripp |
| 2015/0145745 | A1 | 5/2015 | Nguyen |

FOREIGN PATENT DOCUMENTS

| | | | | |
|---|---|---|---|---|
| KR | WO 2013100432 | A1 * | 7/2013 | ................ H01P 5/10 |
| WO | 0046921 | | 8/2000 | |
| WO | 2005057787 | A1 | 6/2005 | |
| WO | 2011094471 | A1 | 8/2011 | |
| WO | 2013190275 | A1 | 12/2013 | |
| WO | 2013190276 | A1 | 12/2013 | |

OTHER PUBLICATIONS

GB Intellectual Property Office Search Report under Section 17(5) received for GB Patent Application No. 1210817.1 mailed Oct. 8, 2012. 3 pages.

International Preliminary Report on Patentability and Written Opinion received for Patent Application No. PCT/GB2013/051573, mailed on Dec. 31, 2014. 8 pages.

International Search Report and Written Opinion received for Patent Application No. PCT/GB2013/051571, mailed on Sep. 19, 2013. 12 pages.

GB Intellectual Property Office Search Report under Section 17(5) received for GB Patent Application No. 1210816.3 mailed Oct. 8, 2012. 3 pages.

Tzyh-Ghuang Ma; Chin-Feng Chou, A Compact Multilayered Magic-T Microstrip Form and Its Application to Microwave Symposium Digest, 2008 IEEE MTT-S International, Jun. 15, 2008. pp. 887-890.

International Preliminary Report on Patentability and Written Opinion received for Patent Application No. PCT/GB2013/051571, mailed on Dec. 31, 2014. 9 pages.

* cited by examiner

BALUN

FIELD OF THE DISCLOSURE

This invention relates to baluns, antenna arrangements incorporating baluns, and to associated methods of operating a balun, with particular, but not necessarily exclusive, reference to microwave baluns.

BACKGROUND

Baluns are well-known passive electrical devices. The term "balun" is derived from the abbreviation of the two terms 'balanced' and 'unbalanced'. Baluns are 3-port devices which convert signals from an unbalanced transmission line to a balanced transmission line and vice-versa. The two balanced ports should provide a signal equal in amplitude with a 180 degree phase difference.

Microwave balun devices can be implemented in various ways, such as in transformer-type arrangements, coupled transmission lines and transmission line junctions. It is known from US2005/0105637 and Bialkowski and Abbosh (M E Bialkowski and A M Abbosh, IEEE Microwave and Wireless Components Letters, Vol. 17, No. 4, April 2007) how to implement baluns using microwave techniques involving microstrips and slotlines. However, it would be desirable to improve the performance characteristics of these devices. In particular, it would be desirable to achieve a wider frequency range over which useful operation of the device can be achieved.

SUMMARY

The present invention, in at least some of its embodiments, addresses the above described problems and desires.

According to a first aspect of the invention there is provided a balun for dividing an input electrical signal to produce first and second output electrical signals which are substantially out of phase, the balun including: an input port for receiving the input electrical signal; an input line for coupling the input electrical signal to a slotline; and an output line for coupling the first and second output electrical signals to, respectively, a first output port and a second output port, the output line having a junction with the slotline; wherein the slotline couples the input electrical signal to the junction, and the junction acts as a divider to produce the first and second electrical signals;

in which at least one of the input line, slotline and output line has a width and a length wherein the width varies over the length.

By varying the width of at least one of the input line, slotline and output line it is possible to fine tune the device impedance so as to extend the operational bandwidth of the device.

At least one of the input line and the output line may be a microstrip.

In some embodiments, both of the input line and the output line are microstrips.

At least one of the input line and the output line may be a stripline.

In some embodiments, at least one of the input line, slotline and output line is tapered. In some embodiments, all of the input line, slotline and output line are tapered. Any one, or any pair, of the input line, slotline and output line may be tapered. Without wishing to be limited by any particular theory or conjecture, it is believed that by tapering the width, it is possible to optimise the transmission line impedance for improved balun performance. In particular, it is possible to minimise or at least reduce the magnitude of the reflection coefficient.

In some embodiments, at least one of the input line, slotline and output line has one or more stepped sections to provide a width which varies over the length. In certain embodiments, the output line has at least one stepped section, and two or more stepped sections may be provided. Without wishing to be limited by any particular theory or conjecture, it is believed that abrupt steps in the width of the transmission line create an impedance mismatch which results in a non-zero reflection coefficient. The transmission line is defined by the input line, slotline and output line. The variation in the width due to stepping can be arranged so that a standing wave is formed from the superposition of multiple reflected signals. Destructive interference of the reflected signals can be arranged, in order to minimise or at least reduce the overall reflection coefficient or standing wave ratio. In this way it is possible to improve the effective bandwidth of the device.

The output line may have a have a width which varies over its length. Additionally, or alternatively, the slotline may have a width which varies over its length in the vicinity of the junction.

Generally, the first and second output electrical signals are substantially 180° out of phase.

Generally, the first and second output electrical signals are of substantially equal amplitude.

In certain embodiments, the output line is substantially symmetrical about the slotline. The output line may be substantially U-shaped so as to provide output ports that are opposite the input port.

The slotline may have two ends which are each terminated by an open circuit termination.

The input line may have a first end which is coupled to the input port and a second end which is terminated by an open circuit termination or a short circuit termination.

The balun may be in the form of a printed circuit board (PCB).

The balun may be a microwave balun device. The balun may be in the form of a microwave laminate structure. Microwave laminate structures are understood to comprise one or more dielectric substrates with one or more layers of a conductor, typically copper, formed thereon in a desired pattern.

The balun may have a plurality of vias formed therein. The vias may be disposed so as to suppress parallel plate modes, for example parallel plates modes caused by asymmetry in components of the balun, particularly layer structures.

At least a portion of the slotline may be sandwiched between a first and a second layer of dielectric material.

According to a second aspect of the invention there is provided an antenna arrangement including an antenna which is fed electrical signals from a balun of the first aspect of the invention.

According to a third aspect of the invention there is provided a method of operating a balun of the first aspect of the invention including: inputting an input electrical signal to the balun, and outputting from the balun first and second output electrical signals which are substantially out of phase.

The input electrical signal may be a microwave signal.

The frequency of the input electrical signal may be in the range 1 to 40 GHz or thereabouts. In some embodiments, the input electrical signal is in the range of 2 to 18 GHz. Higher frequencies than 40 GHz may be possible with appropriate manufacturing techniques.

Whilst the invention has been described above, it extends to any inventive combination of the features set out above, or in the following description, drawings or claims.

BRIEF DESCRIPTION OF THE DRAWINGS

Embodiments of devices in accordance with the invention will now be described with reference to the accompanying drawings, in which:—

DETAILED DESCRIPTION

Figure 1A:
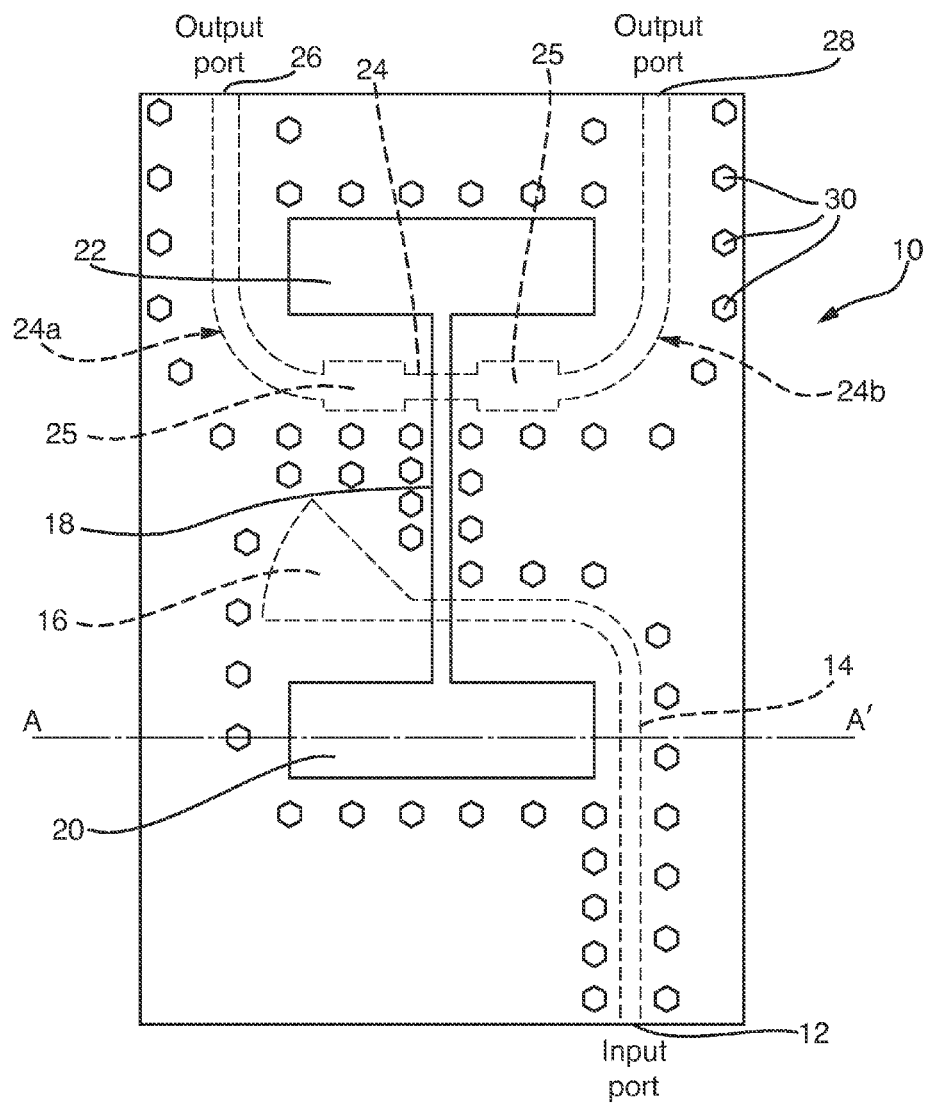
FIG. 1 shows (a) a plan view of a first embodiment of a balun of the invention and (b) a cross sectional view along the line A-A'.

FIG. 1 shows a first embodiment of a balun of the invention, depicted generally at 10, in the form of a PCB. The balun 10 has an input port 12 leading to an input line 14 which can be a microstrip or a stripline. The input line 14 terminates in an open circuit stub 16. The balun 10 further comprises a slotline 18. The slotline 18 is terminated at both of its ends by open circuits 20, 22. Just prior to its termination by the stub 16, the input line 14 crosses the slotline 18 substantially at right angles to form an input line-slotline junction. This junction is formed towards the end of the slotline 18 which is closest to the input port 12. The balun 10 further comprises a generally U-shaped output line 24. The output line 24 can be in the form of a microstrip or a stripline. The output line 24 crosses the slotline 18 substantially at right angles to form a junction. This junction is formed towards the end of the slotline 18 which is nearer to output ports 26, 28. The output line 24 can be regarded as comprising two arms 24a, 24b. The arm 24a connects the junction of the output line 24 with the slotline 18 to the output port 26. The arm 24b connects the junction of the output line 24 with the slotline 18 to the output port 28. The balun 10 further comprises a plurality of circular vias 30 which, as would be readily understood by the skilled reader, are plated through holes in the PCB structure.

Figure 1B:
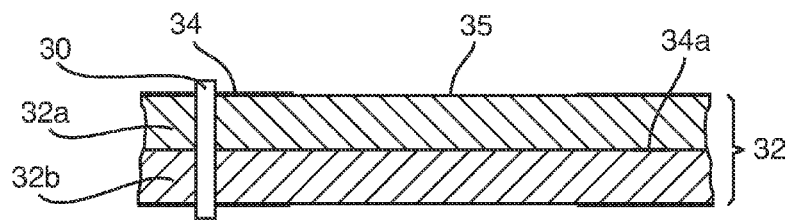

FIG. 1(b) is a cross sectional view along the line A-A' of FIG. 1(a). The PCB comprises a dielectric substrate 32 which is made up of a first substrate layer 32a and a second substrate layer 32b which can be attached in a suitable manner, such as by bond-ply. Layers of copper present are shown with thick lines and denoted by the numeral 34. A copper layer 34a is part of the microstrip 14. The copper layers 34 are removed in the central region of the dielectric substrate 32 as shown in FIG. 1(a) to leave a slot 35 which corresponds to the open circuit 20.

The balun 10 can be considered to have two sections, namely an input section which includes a transition from the input line 14 (a stripline or microstrip track) to the slotline 18, and an output section which includes a transition from a slotline 18 to the output line 24 (two stripline or microstrip tracks 24a, 24b). In use, an input electrical signal is inputted at the input port 12 and is coupled via the input line 14 and the slotline 18 to the junction between the slotline 18 and the output line 24. At this junction substantially identical contra-propagating electrical signals of opposite polarity are created which are coupled by the arms 24a, 24b to the output ports 26, 28. The balun described in Bialkowski and Abbosh achieves a 3.4:1 frequency range (fmax/fmin ratio) for a −10 dB input match. Baluns of the present invention can provide a frequency range of at least 4:1 for a more demanding −15 dB input match threshold. The improvement is due to the steps and tapered widths of the input and output lines 14, 24 and slotline 18. The baluns as described in Bialkowski and Abbosh and US 2005/0105637 utilise straight tracks and slotlines. These devices rely on the junction between the microstrips and slotlines to provide an input/output match. However, this places limitations on the effective bandwidth. By varying the width of one or more of the input line, slotline and output line, such as by steps or tapering, it is possible to vary the impedance along the length of the signal transmission track provided by the input line, slotline and output line. In this way, the impedances of the transmission track can be tuned so as to obtain a wideband input match. It can be seen that in FIG. 1, the widths of the input line 14, slotline 18, and both arms 24a, 24b of the output line 24 are tapered. Additionally each arm 24a, 24b has a stepped section 25.

The width of a microstrip, stripline or slotline transmission line determines its characteristic impedance at microwave frequencies. The present invention enables the impedance of the transmission track to be optimised by varying the width of the transmission track. Broadly speaking, this can be achieved by tapering or stepping the width. Tapered transmission lines are created when the width is gradually reduced or increased along the length of the transmission line. This can be done so as to vary the associated impedance in such a manner that the magnitude of the reflection coefficient is kept to a minimum, or at least reduced. In this way, transmission line impedances can be transformed from commonly used values such as 50 Ohms to other impedances which are more desirable for optimum balun performance.

The applicants have found that in prior art baluns, the transition from stripline or microstrip to slotline is not well matched over a wide working frequency range. The input section may utilise open circuit features in order to improve the impedance match, but it has been found that this is not sufficient to provide a wide working frequency range which is desired in many modern applications. Further improvements (especially for the output section, where the stripline does not terminate at the slotline junction) can be obtained by utilising abrupt steps in the width of the transmission lines. Stepped features create an impedance mismatch which results in a non-zero reflection coefficient. Multiple impedance mismatches, separated by variable lengths of transmission line, will interfere, resulting in a standing wave formed from the superposition of the multiple reflected signals. The variable lengths of the transmission line separating the reflected signals can be used to cause destructive interference in order to minimise the standing wave ratio. It is desirable to minimise or at least reduce the overall reflection coefficient standing wave ratio by optimising the parameters associated with the number, magnitude and separation of the impedance mismatches. These general principles can be implemented in numerous ways, and design rules for the implementation will now be described.

As noted above, the balun can be considered to have an input section and an output section. A minimum separation is required between these two sections to avoid the asymmetry of the input section affecting the phase and amplitude balance of the output section. In general, this tends to be the only limitation on amplitude and phase balance. An initial design can be achieved by tuning the two sections in isolation and subsequently combining them before the final optimisation of the design parameters. An iterative process can be used to determine the final design parameters. The interactions between steps and tapered impedances are used to obtain a wideband input match. The design parameters consist of the stripline/microstrip and slotline widths, lengths and offsets, slotline cavity dimensions and stripline/microstrip open circuits stub dimensions. Typical dimensions for the stub and other terminations are of the order of a quarter of a wavelength or less at the centre frequency. Representative but non-limiting dimensions for a balun operating up to 18 GHz are ca 9 mm×18 mm×1 mm, although the skilled reader will appreciate that the dimensions utilised depend upon the dielectric constant and the thickness of the laminate and substrate materials used. Basic design principles for stripline/microstrip to slotline transitions are known for so-called Vivaldi or Tapered Slot Antennas which have tapered slotlines.

The vias 30 are disposed as to suppress parallel plate modes caused by slight asymmetry in the layers making up the PCB structure.

Figure 2A:
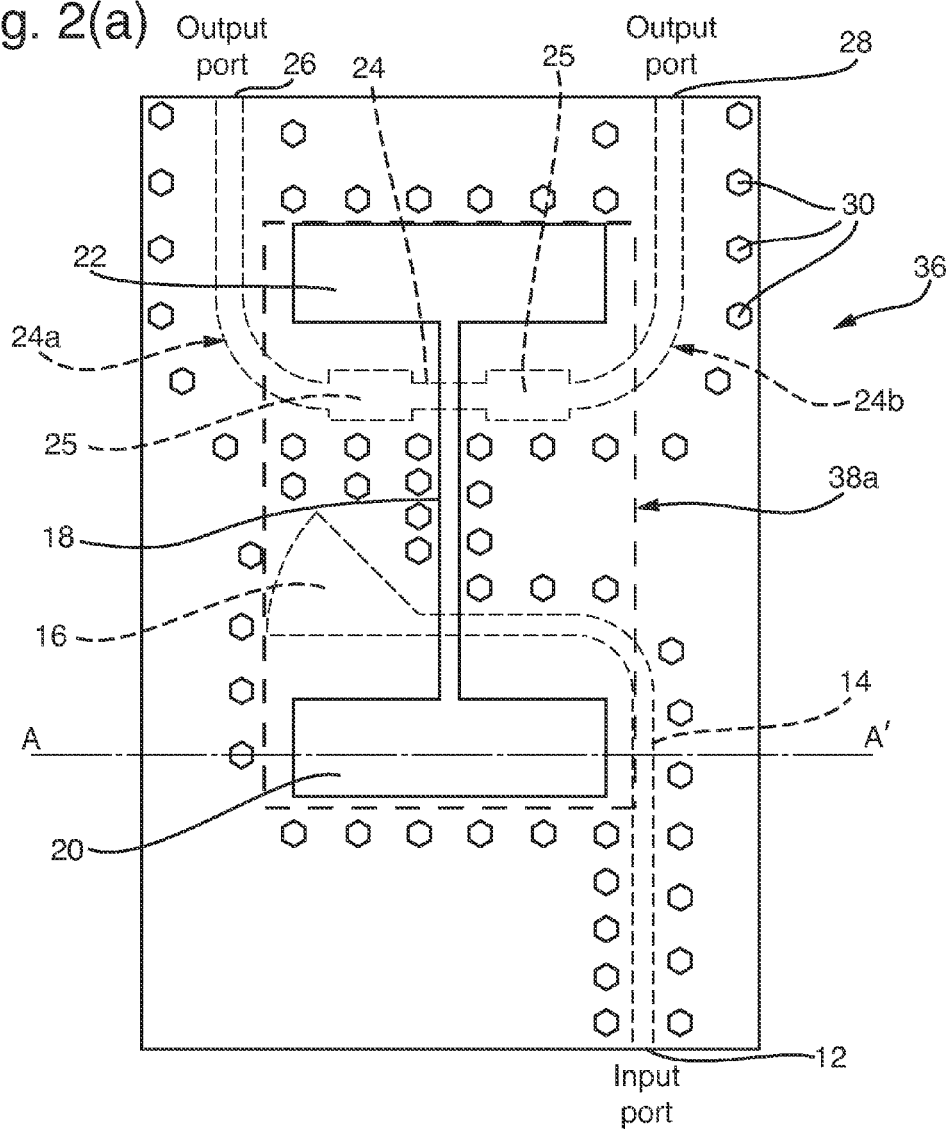
FIG. 2 shows (a) a plan view of a second embodiment of a balun of the invention and (b) a cross sectional view along the line A-A'.
Figure 2B:
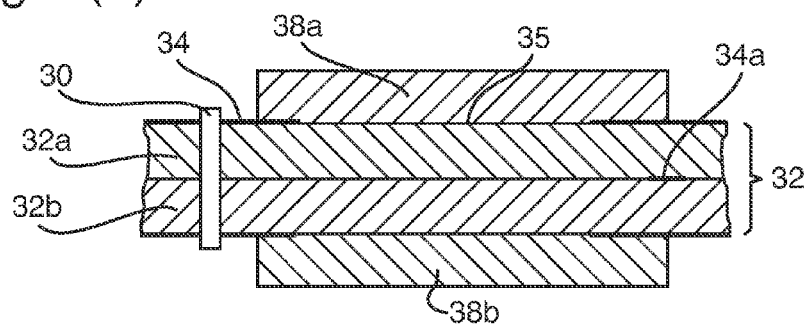

FIG. 2 shows second embodiments of a balun of the invention, depicted generally at 36. The balun 36 is a variant of the balun 10 of the first embodiment of the invention having further features which are described in more detail below. The balun 36 shares all of the features depicted in FIG. 1 in relation to the balun 10 of the first embodiment of the invention. Identical numerals are used to denote such shared features. The balun 36 differs from the balun 10 through the provision of two discrete, additional layers of dielectric material. In particular, the balun 36 comprises a discrete upper layer 38a of a dielectric material which is provided on an upper face of the PCB, and a discrete lower layer 38b of a dielectric material provided on a lower face of the PCB. It is preferred that the upper and lower layers 38a, 38b are formed from the same dielectric material as used in the PCB. Examples of suitable dielectric material are produced by Rogers Corporation (Rogers Conn. 06263, USA) under the trade name RO 4000® series high frequency circuit materials. The upper and lower dielectric layers 38a, 38b are formed so as to entirely cover the slotline structure 18, 20, 22. The upper layer of dielectric material 38a is shown in FIG. 2(a) where it is seen to be in the form of a rectangle. Other shapes may be utilised, and the area of the device covered by the upper and lower layers of dielectric material 38a, 38b may be varied, as long as it encompasses the slotline features. Typically, the upper 38a and lower 38b layers of dielectric material are in register with each other, but it is not necessary that this is so. The upper and lower dielectric layers can be attached to the PCB by any convenient means, such as bond-ply.

In a typical prior art slotline structure, a slot is formed in a copper surface on one face of a microwave laminate. Typically this face has a dielectric substrate on one side and air on the other. This results in an effective dielectric constant which is of a value somewhere between that of the substrate and that of air. The dielectric constant of air is assumed to have a value of one, wherein the dielectric constant of a typical microwave substrate material is usually greater than 2.2. The effective dielectric constant for this type of slotline is lower than that for the substrate because some of the field lines formed by a signal propagating along the transmission line appear in the substrate and some appear in the air surrounding the slot. The additional layers of dielectric material provided by this aspect of the present invention have the effect that field lines which would otherwise appear in the air surrounding the slotline are instead enclosed within the dielectric material. The air-dielectric boundary creates an impedance mismatch which limits propagation of field lines beyond this boundary. Accordingly, the effective dielectric constant is increased. This has the advantage that smaller slotline dimensions can be employed, which in turn enables baluns of reduced dimensions to be provided. A further advantage is that, because there is reduced propagation away from the transmission line structure, coupling to any adjacent baluns (or other microwave features or devices) is also reduced. This is particularly advantageous when multiple baluns are used in arrays. An example of this is when multiple baluns are used in arrays of antennas where the radiating elements spacing is limited and signal coupling between baluns may affect performance. Similar advantages may arise in other devices which feature slotline structures.

Figure 3A:
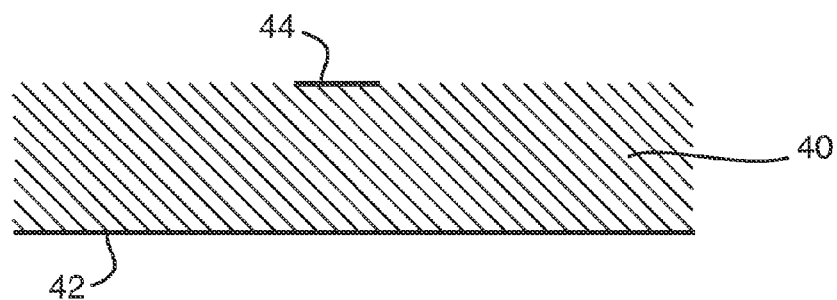
FIG. 3 shows cross sectional views of (a) a microstrip, (b) a stripline and (c) a slotline.
Figure 3B:
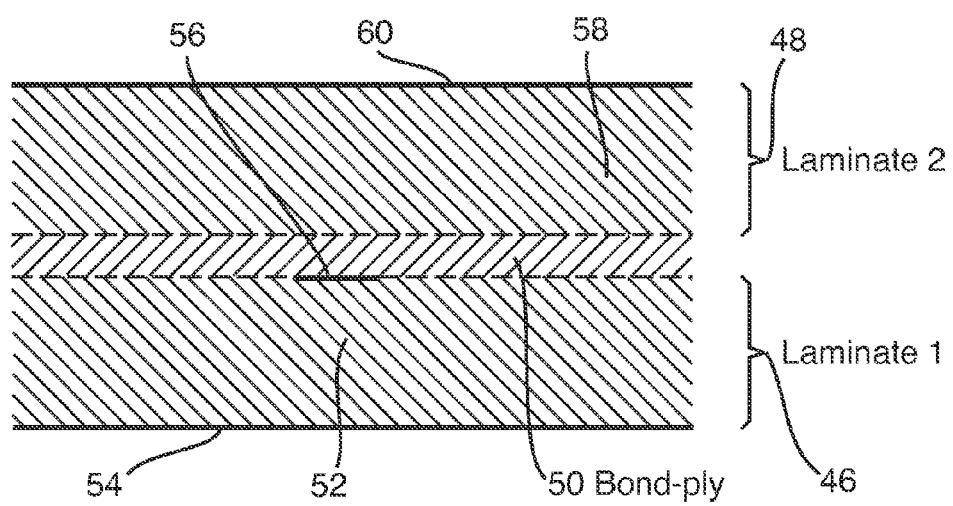
Figure 3C:
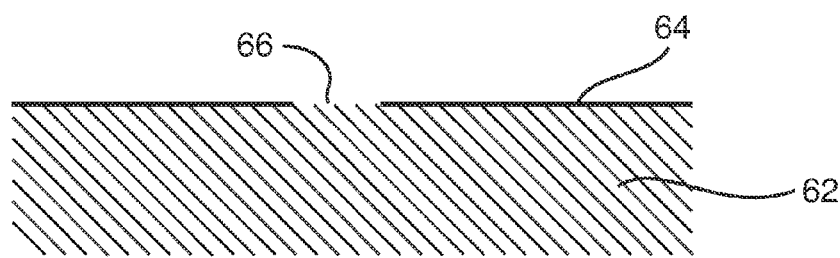

Baluns such as those described with reference to FIGS. 1 and 2 can be fabricated using standard microwave PCB manufacturing techniques. For microwave baluns, PCBs are generally of the type known as microwave laminates which make use of low-loss copper-clad dielectric substrates. Suitable PCBs can be obtained from a variety of manufacturers who will be well known to the skilled reader, such as Rogers Corporation (Rogers Conn. 06263, USA) and Taconic (Petersburg, N.Y. 12138, USA). The device structure can be produced by removing copper from desired areas of one or both sides of the laminate. It is also possible to bond laminate sheets together to form multi-layer structures. Multi-layer structures may have multiple combinations of microstrip, stripline or slotline transmission lines. Copper removal is performed to provide copper patterns which are used to form the desired microstrip, stripline or slotline features. FIG. 3 shows generalised cross sectional views of (a) a microstrip, (b) a stripline and (c) a slotline. FIG. 3 (a) shows a microstrip formed from a microwave laminate comprising a dielectric substrate 40 having a full copper layer 42 on a lower face thereof. Copper has been removed on the upper face of the dielectric substrate 40 to leave a copper track 44. FIG. 3(b) shows a stripline formed as a multi-layer structure comprising a first microwave laminate 46, and second microwave laminate 48, and a bond-ply sheet 50 which is used to secure the laminates 46, 48 to each other. The first microwave laminate 46 comprising a dielectric substrate 52 having a complete copper layer 54 formed over a lower face thereof. Copper is removed on the upper face of the dielectric substrate 52 to leave a copper track 56. Copper is removed entirely from a lower face of a dielectric substrate 58 of the microwave laminate 48. The upper face of the dielectric substrate 58 retains a complete copper layer 60. Typically, vias (also known as Plated Through Holes (PTH)) are used to limit the propagation of parallel plate modes resulting from the asymmetry caused by the bond-ply 50. FIG. 3(c) shows a slotline formed from a microwave laminate which comprises a dielectric substrate 62 having a copper layer 64 on an upper face thereof. Copper is removed from the copper layer 64 to create a slot. The copper on the lower face of the dielectric substrate 62 may be removed entirely.

Baluns produced in accordance with the invention have been shown to provide an excellent frequency range even for an input match of −15 dB or better. Adjusting for variations which were believed to be due to a connector mismatch, excellent amplitude and phase balance in the two output electrical signals have been observed. An amplitude balance of +−0.025 dB and a phase balance of +−10° have been observed.

Baluns of the invention are particularly suitable for use in feeding an antenna. An array of baluns may be utilised.

However, the baluns of the invention may be used for other purposes such as in a microwave circuit.

The invention claimed is:

1. An antenna arrangement including an antenna which is fed electrical signals from a balun for dividing an input electrical signal to produce first and second output electrical signals which are substantially out of phase, the balun including:
   an input port for receiving the input electrical signal;
   an input line for coupling the input electrical signal to a slotline; and
   an output line for coupling the first and second output electrical signals to, respectively, a first output port and a second output port, the output line having a junction with the slotline;
   wherein the slotline couples the input electrical signal to the junction, and the junction acts as a divider to produce the first and second output electrical signals; and
   wherein at least one of the input line, the slotline, and the output line is a tapered transmission line in which a width of the tapered transmission line gradually increases or decreases along a length of the tapered transmission line.

2. A balun for dividing an input electrical signal to produce first and second output electrical signals which are substantially out of phase, the balun comprising:
   an input port for receiving the input electrical signal;
   an input line for coupling the input electrical signal to a slotline; and
   an output line for coupling the first and second output electrical signals to, respectively, a first output port and a second output port, the output line having a junction with the slotline;
   wherein the slotline couples the input electrical signal to the junction, and the junction acts as a divider to produce the first and second output electrical signals; and
   wherein at least one of the input line, the slotline, and the output line is a tapered transmission line in which a width of the tapered transmission line gradually increases or decreases along a length of the tapered transmission line.

3. The balun according to claim 2, wherein at least one of the input line and the output line is a microstrip.

4. The balun according to claim 2, wherein at least one of the input line and the output line is a stripline.

5. The balun according to claim 2, wherein the tapered transmission line has one or more stepped sections over which the width of the tapered transmission line gradually increases or decreases.

6. The balun according to claim 2, wherein at least one of the output line and the slotline has a width which varies over its length in the vicinity of the junction.

7. The balun according to claim 2, wherein the output line is substantially symmetrical about the slotline.

8. The balun according to claim 7, wherein the output line is substantially U-shaped.

9. The balun according to claim 2, wherein the slotline has two ends which are each terminated by an open circuit termination.

10. The balun according to claim 2, wherein the input line has a first end which is coupled to the input port and a second end which is terminated by an open circuit termination or a short circuit termination.

11. A printed circuit board (PCB) comprising the balun according to claim 2.

12. A microwave laminate structure comprising the balun according to claim 2.

13. A method of operating a balun according to claim 2, the method comprising:
    inputting an input electrical signal to the balun; and
    outputting from the balun first and second output electrical signals which are substantially out of phase.

14. The method according to claim 13, wherein the frequency of the input electrical signal is in the range 1 to 40 GHz.

15. The method according to claim 13, wherein at least one of the input line and the output line comprises at least one of a microstrip and a stripline.

16. The method according to claim 13, wherein the output line is substantially symmetrical about the slotline.

17. The method according to claim 13, wherein the output line is substantially symmetrical about the slotline and in which the output line is substantially U-shaped.

18. The method according to claim 13, wherein the slotline has two ends which are each terminated by an open circuit termination.

19. The method according to claim 13, wherein the input line has a first end which is coupled to the input port and a second end which is terminated by an open circuit termination or a short circuit termination.

* * * * *